United States Patent
Song et al.

(10) Patent No.: US 7,392,924 B2
(45) Date of Patent: Jul. 1, 2008

(54) AUTOMATED BALL MOUNTING PROCESS AND SYSTEM WITH SOLDER BALL TESTING

(75) Inventors: Kong Lam Song, Penang (MY); Peng Cheong Choe, Penang (MY); Tic Medina, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 266 days.

(21) Appl. No.: 10/990,123

(22) Filed: Nov. 16, 2004

(65) Prior Publication Data

US 2005/0279813 A1   Dec. 22, 2005

(30) Foreign Application Priority Data

Jun. 18, 2004   (MY) .............................. PI 2004 2408

(51) Int. Cl.
*B23K 37/00* (2006.01)
*B23K 31/02* (2006.01)

(52) U.S. Cl. .............................. 228/8; 228/41; 228/103; 228/246

(58) Field of Classification Search .................. 228/103, 228/180.22
See application file for complete search history.

(56) References Cited

U.S. PATENT DOCUMENTS

| | | | |
|---|---|---|---|
| 5,494,856 A | | 2/1996 | Beaumont et al. |
| RE35,423 E | * | 1/1997 | Adams et al. .................. 378/58 |
| 5,601,229 A | * | 2/1997 | Nakazato et al. ............. 228/246 |
| 5,741,410 A | * | 4/1998 | Tsurushima ................. 228/44.7 |
| 5,785,237 A | * | 7/1998 | Lasto et al. ............. 228/180.22 |
| 5,788,143 A | * | 8/1998 | Boyd et al. .................. 228/253 |
| 5,839,641 A | * | 11/1998 | Teng ............................. 228/41 |
| 6,084,397 A | * | 7/2000 | Downes .................... 324/158.1 |
| 6,158,649 A | | 12/2000 | Miura |
| 6,193,173 B1 | * | 2/2001 | Bodelin et al. ............... 239/589 |
| 6,460,755 B1 | * | 10/2002 | Inoue et al. .................. 228/246 |
| 6,595,404 B2 | * | 7/2003 | Suzuki et al. ................ 228/175 |
| 6,685,080 B1 | * | 2/2004 | Kee et al. ..................... 228/103 |
| 6,840,667 B2 | * | 1/2005 | Schlagheck et al. ............. 374/5 |
| 2005/0162647 A1 | * | 7/2005 | Okumura et al. ............. 356/316 |
| 2006/0086777 A1 | * | 4/2006 | Itoh et al. .................... 228/253 |
| 2006/0210140 A1 | * | 9/2006 | Zaykova-Feldman et al. .... 382/141 |

OTHER PUBLICATIONS

PCT International Search Report, International Application No. PCT/US05/20243, Jun. 7, 2005, 10 pages, cited by other.

* cited by examiner

*Primary Examiner*—Kiley Stoner
(74) *Attorney, Agent, or Firm*—Kenneth Glass; Glass & Associates (57) ABSTRACT

An automated ball mounting system is disclosed In which solder balls are tested by heating the solder balls to a temperature between the eutectic temperature of lead-tin and the melting temperature of a lead free solder ball. If the heated solder balls melt they are standard solder balls. If they do not melt they are lead free solder balls. Solder balls that are input into the automated ball mounting process are automatically tested to determine solder ball type. When the test indicates that the wrong type of solder ball is being used an error message is indicated and the solder ball mounting process stops.

12 Claims, 5 Drawing Sheets

AUTOMATED BALL MOUNTING PROCESS AND SYSTEM WITH SOLDER BALL TESTING

CROSS REFERENCE TO RELATED APPLICATIONS

This application claims the benefit of Malaysian Patent Application No. PI20042408, filed on Jun. 18, 2004.

FIELD OF THE INVENTION

The present invention relates to the field of semiconductor devices. More specifically, the present invention relates to solder ball mounting processes and systems.

BACKGROUND ART

Automated solder ball mounting systems have been developed that quickly and accurately attach solder balls to substrates. The solder ball type most commonly used in these systems is the standard solder ball. Standard solder balls are formed of a lead-tin alloy. However, for environmental reasons there has been an increasing need for the use of lead free solder balls.

The requirement that a manufacturing facility be able to attach both standard solder balls and lead free solder balls has forced some manufacturing facilities to purchase additional dedicated ball mounting systems to mount lead free solder balls. However, when both standard solder balls and lead free solder balls are used in the same manufacturing facility, workers can accidentally input the wrong type of solder ball into a solder ball mounting system. This can result in numerous defective products being fabricated before the problem is discovered.

To minimize the potential for defective products resulting from attachment of the wrong solder ball type, sample parts are produced and are sent to a laboratory for analysis before the start of production. Typically these labs determine solder ball type using x-ray fluorescent equipment that indicates tin content. The lab test delays the start-up of production, reducing equipment utilization rates and reducing efficiency. Moreover, though testing prior to start up of production assures that the production process will start off with the correct solder ball type it is still possible that a worker may input the wrong type of solder ball into the ball mounting system during production.

Accordingly what is needed is an automated ball mounting process and system that will minimize or eliminate product defects resulting from the use of the wrong solder ball type. Also, there is a need for a method and apparatus that meets the above need and that can mount both standard solder balls and lead free solder balls. The present invention meets the above needs.

DISCLOSURE OF THE INVENTION

The present invention provides an automated solder ball mounting process and system in which solder ball type is tested in order to assure that the correct type of solder ball is being used. This results in reduced down time and reduced defect rates.

An automated solder ball mounting process and an automated ball mounting system are disclosed in which solder balls are tested to determine solder ball type. When the test is performed and the wrong solder ball type is being used an error message is indicated and the solder ball mounting process is stopped. This prevents product defects that can result from the use of the wrong solder ball type. In addition, a single solder ball mounting system can be used to attach both standard solder balls and lead free solder balls while preventing product defects that can result from use of the wrong solder ball type. The use of a single system instead of two dedicated systems results in significant cost savings as compared to prior art processes that use one dedicated system for standard solder balls and a second dedicated system for lead free solder balls.

By preventing the attachment of the wrong solder ball type, the method and apparatus of the present invention results in reduced product defects. In addition the method and apparatus of the present invention allows for quicker start-up of the manufacturing process as there is no need to send-solder ball samples to a test lab and wait for test results.

These and other advantages of the present Invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, Illustrate embodiments of the invention and, together with the description, serve to explain the principles of the invention.

The drawings referred to In this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Standard solder balls are composed of a lead-tin alloy that is approximately 63 percent tin (Sn) and 37 percent lead (Pb). Eutectic temperature is the lowest temperature at which a mix of two materials will melt. Standard solder balls melt at the eutectic temperature of lead-tin which is 180 degrees Centigrade. This temperature is significantly less than the melting temperature of lead alone (327 degrees Centigrade) and the melting temperature of tin alone (231 degrees Centigrade).

The melting temperature of lead free solder balls is typically much higher than the eutectic temperature of lead-tin. One type of common lead free solder ball has 96.5 percent Sn, 3 percent silver (Ag) and 0.5 percent copper (Cu) (hereinafter referred to as a Sn/Ag/Cu lead free solder ball) that melts at 217-219 degrees Centigrade. Another common lead free solder ball includes 96.5 percent Sn, 2 percent Ag, 0.75 percent Cu and 3 percent Bismuth (Bi) (hereinafter referred to as a Sn/Ag/Cu/Bi lead free solder ball) that melts at 210-216 degrees Centigrade.

The methods and apparatus of the present invention take advantage of the difference between the melting temperature of standard solder balls and the melting temperature of lead free solder balls by heating solder balls to a temperature greater than the eutectic temperature of lead-tin and less than the melting temperature of lead free solder balls. If the solder balls melt they are standard solder balls. If they do not melt they are lead free solder balls.

Figure 1:
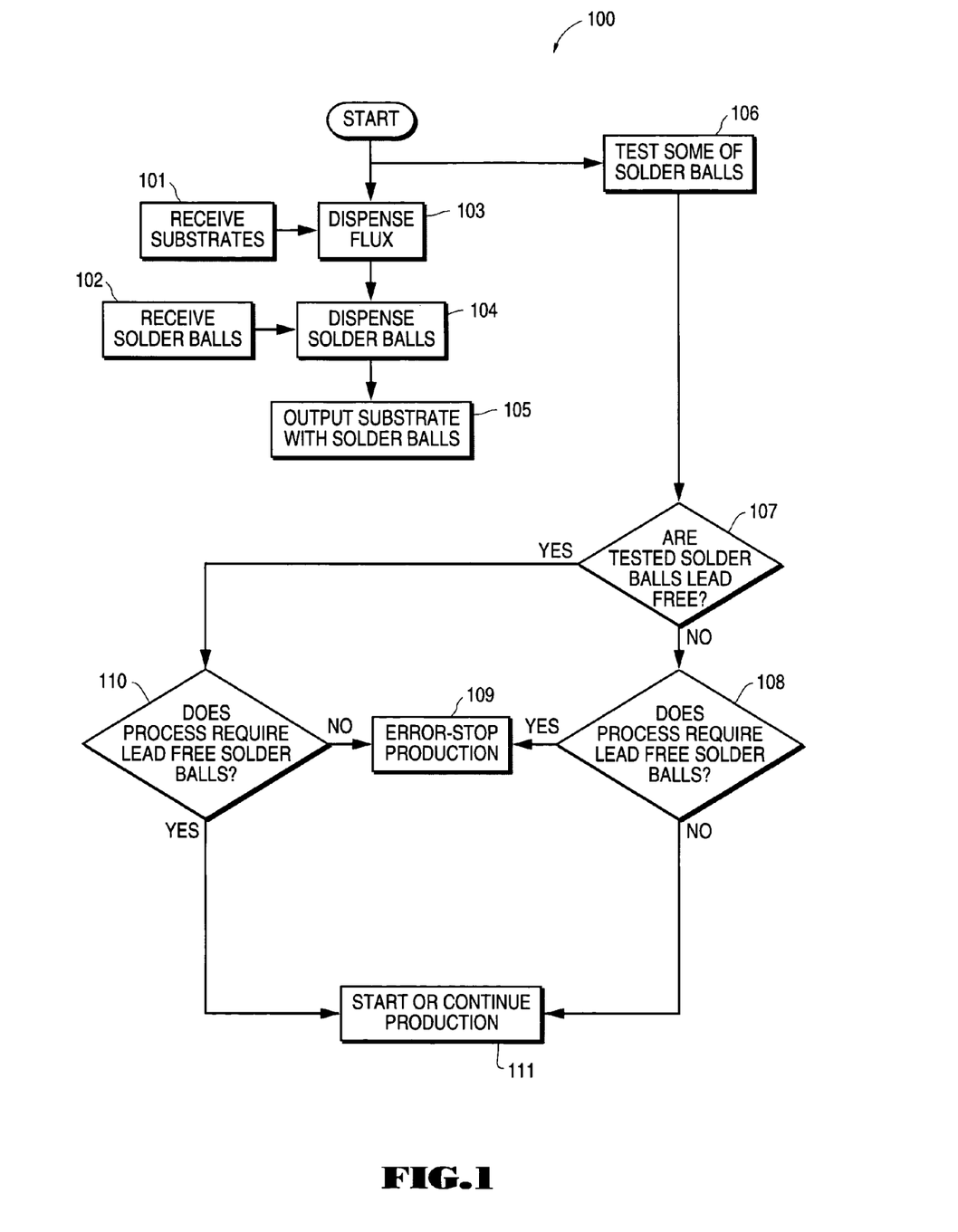
FIG. 1 is a flow chart that illustrates an automated ball mounting process in which solder balls are tested to determine whether they are standard solder balls or lead free solder balls in accordance with one embodiment of the present invention.

FIG. 1 illustrates an automated ball mounting process 100 in which solder ball type is determined. Referring now to steps 101-102 substrates and solder balls are received into the automated process. The received substrates are sequentially advanced through the process of steps 103-105, with flux dispensed onto each substrate as shown by step 103 and solder balls dispensed onto each substrate as shown by step 104. The substrates with attached arrays of solder balls are then output as shown by step 105. These substrates can then be loaded into an oven to reflow the solder balls.

Referring now to step 106 some of the solder balls that are input into the automated process are tested to determine whether the tested solder balls are lead free. This test is automatically performed during the automated ball mounting process and does not require that solder balls to be tested be removed from the ball mounting system. As shown by step 107-109, when the process requires lead free solder balls and when the test indicates that the tested solder balls are not lead free an error indication is provided to the operator and production is discontinued by stopping the automated ball mounting process.

Similarly, as shown by step 107 and 109-110, when the process does not require lead free solder balls and when the test indicates that the solder balls are lead free solder balls an error indication is generated and production is discontinued by stopping the automated ball mounting process.

When an error is detected in accordance with step 109 at start-up the process of steps 103-105 is never initiated, preventing defective products from being fabricated. When an error is detected in accordance with step 109 during the production process of steps 103-105, the process of steps 103-105 is stopped and an error indication is generated to prevent the manufacture of defective products.

As shown by step 107-108 and 111, when the process requires lead free solder balls and when the test indicates that the tested solder balls are lead free solder balls production is started or continued. Similarly, as shown by steps 107 and 110-111, when the process requires standard solder balls and when the test Indicates that the tested solder balls are standard solder balls production is started or continued. More particularly, when a match is detected in accordance with step 111 at start-up the process of steps 103-105 is initiated, starting the production process. When a match is detected in accordance with step 111 during the production process of steps 103-105, the process of steps 103-105 is continued. In the present embodiment the processes of steps 106-111 are performed in a fully automated manner, without any need for operator intervention, leading to automated shut-down, start-up or continuation of the production process.

Figure 2:
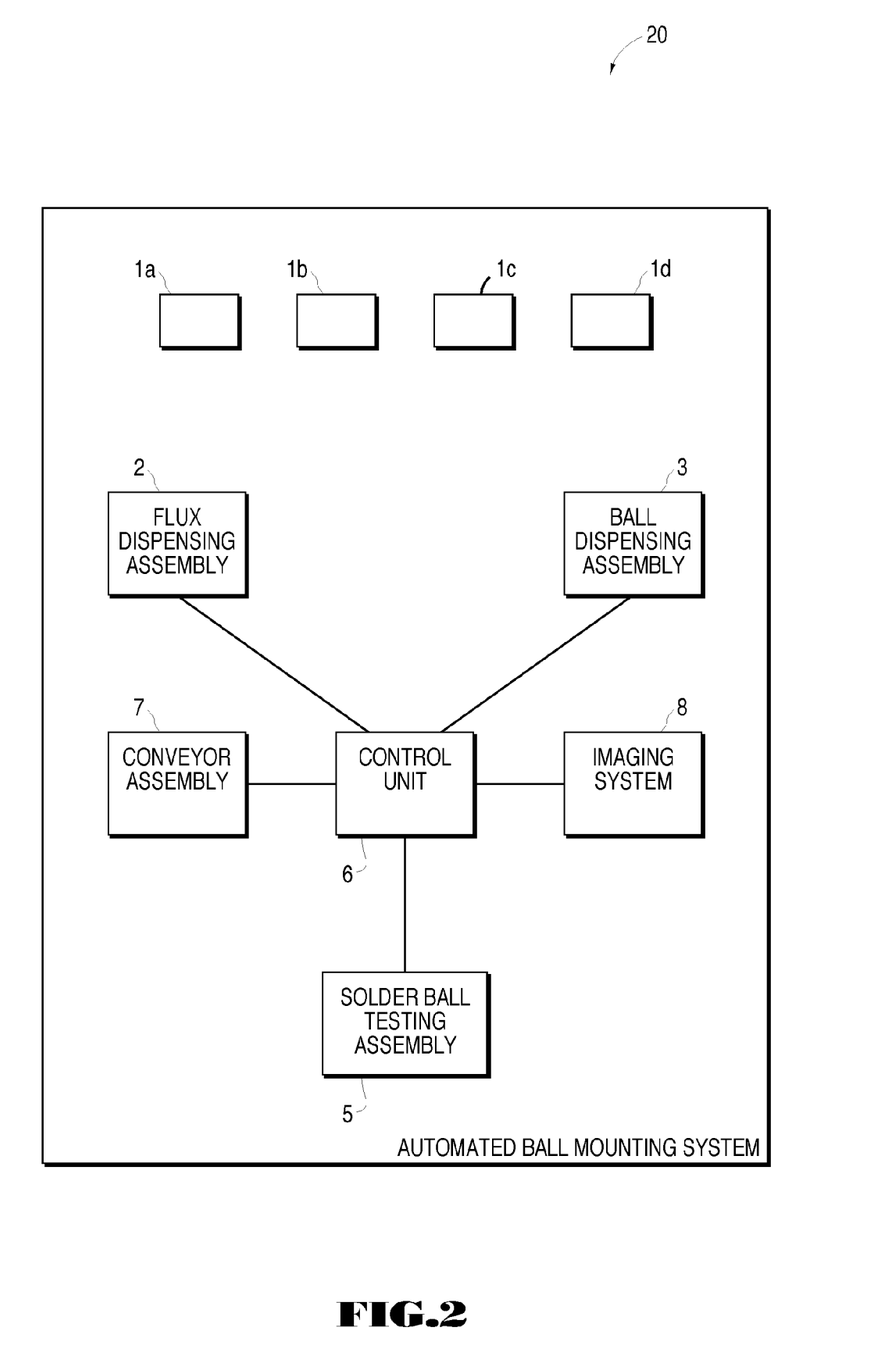
FIG. 2 is a diagram that illustrates an automated ball mounting system in accordance with one embodiment of the present invention.

Referring now to FIG. 2, an automated ball mounting system 20 is disclosed that can be used to perform process 100. Automated ball mounting system 20 receives substrates (step 101) at input magazines 1a-d. In the present embodiment input magazines 1a-d are slotted magazines that can receive strip Ball Grid Array (BGA) substrates. The BGA substrates can be Ceramic Ball Grid Array (CBGA) substrates, Plastic Ball Grid Array (BGA) substrates or any other type of substrate that is adapted to receive an array of solder balls. The BGA substrates advance from slotted magazines 1a-d to flux dispensing assembly 2 where flux is dispensed onto each BGA substrate.

Each BGA substrate then advances to the ball dispensing assembly 3 where solder balls are dispensed onto each BGA substrate. In the present embodiment ball dispensing assembly 3 includes a ball placement tool and a ball pattern tool that Include ejection pins that eject solder balls onto each BGA substrate so as to form the required BGA pattern. Alternatively, ball dispensing assembly 3 can use screen printing or any other methodology for dispensing solder balls onto BGA substrates.

In the present embodiment ball dispensing assembly 3 includes a solder ball canister that receives solder balls that are input into automated ball mounting system 20. The solder ball canister can be color coded to indicate the type of solder balls that it should contain. In the present embodiment the solder ball canister for receiving lead free solder balls is colored green, and the solder ball canister for receiving standard solder balls is a different color.

In the present embodiment ball dispensing assembly 3 is quickly and easily convertible from dispensing one type of solder ball to dispensing a different type of solder ball. This can be done by removing the solder ball canister and any residual solder balls in ball dispensing assembly 3 and replacing the solder ball canister with a different type of solder ball canister. For example, conversion from dispensing lead free solder balls to dispensing standard solder balls is accomplished by removing the lead free solder ball canister, removing any residual lead free solder balls in dispensing assembly 3 and installing a standard solder ball canister. Similarly, conversion from dispensing standard solder balls to dispensing lead free solder balls is accomplished by removing the standard solder ball canister, removing any residual standard solder balls in dispensing assembly 3 and installing the lead free solder ball canister. This allows for using the same automated ball mounting system 20 for attaching both lead free solder balls and standard solder balls.

In the present embodiment automated ball mounting system 20 includes a conveyor system 7 that is coupled to control unit 6. Conveyor system 7 is operable to move BGA substrates to the different stations within ball mounting system 20. In the present embodiment conveyor system 7 includes one or more conveyor belts that move BGA substrates from input magazines 1a-d to flux dispensing assembly 2, ball dispensing assembly 3, and output substrates having an array of solder balls attached thereto.

Automated ball mounting system 20 includes imaging system 8 that is electrically coupled to control unit 6. Imaging system 8 generates images at various locations within ball mounting system 20 that are transmitted to control unit 6. Control unit 6 is operable to control the operation of some or all of the components of automated ball mounting system 20. In the present embodiment control unit 6 is a computing device that includes a processor, memory storage, one or more data input devices and one or more data output devices.

By operation of control unit 6 the operator can control the operations of each of the components of automated ball mounting system 20. In the present embodiment control unit 6 is operable upon receiving images from imaging system 8 to analyze the received images. Control logic within control unit 6 uses the analysis of images and input from components 1a-d, 2-3, 5 and 7-8 for controlling the operation of automated ball mounting system 20.

Solder ball testing assembly 5 is operable for determining the type of solder balls in ball dispensing assembly 3. In the embodiment shown in FIGS. 3-5 solder ball testing assembly 5 includes a pick and place mechanism 56 that is operable to move solder balls to be tested from ball dispensing assembly 3 to test block 40. In the present embodiment pick and place mechanism 56 removes solder balls directly from the solder ball canister installed in ball dispensing assembly 3 and moves them onto test block 40.

Figure 3:
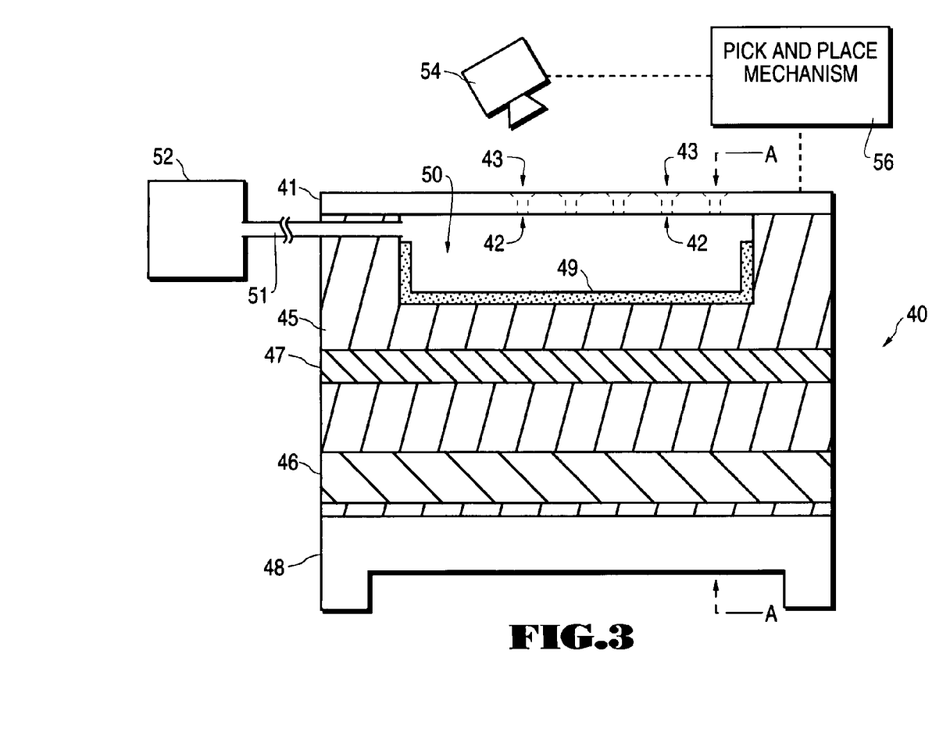
FIG. 3 is a diagram that shows the components of a solder ball testing assembly and illustrates a front cross-sectional view of a test block in accordance with one embodiment of the present invention.
Figure 4:
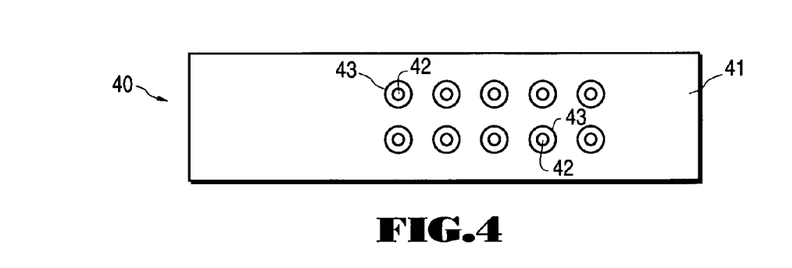
FIG. 4 is a diagram that shows a top view of the test block of FIG. 3 in accordance with one embodiment of the present invention.
Figure 5:
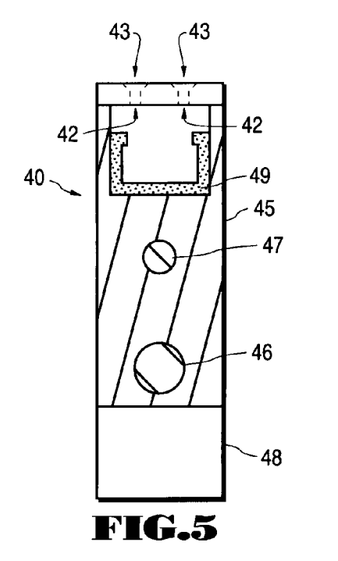
FIG. 5 is a diagram that shows a side cross-sectional view of the test block along section A-A of FIG. 3 in accordance with one embodiment of the present invention.

Referring now to FIGS. 3-5 solder ball testing assembly 5 includes a plate 41 having indentations 43 within the top surface of plate 41 for receiving solder balls. Openings 42 extend through plate 41 below each of indentations 42. Tray 49 extends below openings 42 to retain melted solder ball material. In the embodiment shown in FIGS. 3-5, plate 41 is a thin flat sheet of metal. However, alternatively, plate 41 can be any type of receptacle that can contain one or more solder ball and that can allow for melted solder ball material and unmelted solder balls to be removed therefrom.

Heating device 46 is thermally coupled to plate 41 by heater block 45. In the present embodiment plate 41 and heater block 45 are formed of a material that is conductive to heat such that heat from heating device 46 is conveyed through heater block 45 and through plate 41 so as to heat any solder balls that are placed in indentations 43. Heater block 45 can be metal or any other material that readily conveys heat. Ceramic block 48 attaches to heater block 45 so as to thermally insulate heater block 45 from the other components of ball mounting system 20.

Thermocouple 47 is operable to determine temperature within heating block 45. In the present embodiment both thermocouple 47 and heater 46 are electrically coupled to control unit 6. Control logic within control unit 6 is operable to turn heating device 46 on and off as necessary to maintain the temperature of plate 41 within a given temperature range.

In the present embodiment plate 41 is maintained at a temperature between the eutectic temperature of lead-tin (180 degrees Centigrade) and the melting temperature of lead free solder balls. The term "melting temperature of lead free solder balls" can be the melting temperature of a single type of lead free solder ball or can be the lowest melting temperature for two or more different types of lead free solder balls. More particularly, when a manufacturing process only uses one type of lead free solder ball the temperature used would be the melting temperature of that particular type of solder ball. For example, the melting temperature of a Sn/Ag/Cu lead free solder ball is 217 degrees Centigrade. The melting temperature of a Sn/Ag/Cu/Bi lead free solder ball is 210 degrees Centigrade. When the process uses multiple different types of lead free solder balls the melting temperature of lead free solder balls would be the lowest melting temperature of any of the different types of lead free solder balls used. When the lead free solder balls can be either Sn/Ag/Cu lead free solder balls or Sn/Ag/Cu/Bi solder balls the melting temperature would be 210 degrees Centigrade.

As lead free solder balls can be made of different materials and different. percentages of the various alloys can be used, in one embodiment a temperature range of from 180-210 degrees Centigrade is used. This will differentiate standard solder balls from Sn/Ag/Cu lead free solder balls, Sn/Ag/Cu/Bi solder balls, and any other type of lead free solder ball having a melting temperature greater than 210 degrees Centigrade.

In another embodiment a temperature range of from 180-200 degrees Centigrade is used. This will differentiate standard solder balls from Sn/Ag/Cu lead free solder balls, Sn/Ag/Cu/Bi solder balls, and any other type of lead free solder ball having a melting temperature greater than 200 degrees Centigrade.

In one specific embodiment a temperature range of 185-195 degrees Centigrade is used. This will differentiate standard solder balls from any lead free solder ball having a melting temperature of greater than 195 degrees Centigrade.

Though the present embodiment uses a heating device 46 that is thermally coupled to plate 41, alternatively a heating device could be used that is located proximate plate 41 for heating solder balls that are placed on plate 41. For example, a heating device could be used that is located above plate 41 that supplies radiant heat so as to directly heat any solder balls that are placed on plate 41. Moreover, it is appreciated that heating device 46 could generate heat using electricity, natural gas, or any other fuel source, and could transmit that heat through direct contact, direct or indirect radiation, including thermal or microwave radiation.

Vacuum system 52 is coupled to plate 41 for removing melted solder balls from plate 41. In the present embodiment vacuum system 52 is coupled to cavity 50 beneath plate 41 by hose 51 such that vacuum system 52 can apply suction to openings 42.

Pick-and place mechanism 56 is located proximate to plate 41 and proximate to ball dispensing assembly 3. In the present embodiment pick and place mechanism 56 is operable to pick up solder balls from the solder ball canister installed in ball dispensing assembly 3 and place them into indentations 43. Also, pick and place mechanism 56 is operable to remove unmelted solder balls and place them in a trash receptacle.

Camera 54 is operable to generate images of the top of plate 41. In the present embodiment camera 54 is electrically coupled to control unit 6 such that operation of camera 54 generates images that can be interpreted by control unit 6 to determine whether solder balls are present in indentations 43. In the present embodiment camera 54 and control unit 6 form a detection system that is operable to determine whether solder balls are present in indentations 43. However, alternatively an additional computing device could be included within solder ball testing assembly 5 for analysis of images from camera 54 to determine whether solder balls are present.

FIG. 6 illustrates a process 200 for testing solder balls to determine solder ball type in which test block 40 of FIGS. 3-5 is used to determine solder ball type. First, as shown by step 201 plate 41 is heated. More particularly heating device 46 is turned on and thermocouple 47 is monitored to determine whether plate 41 has reached the required temperature range. Referring to steps 202-203 if the temperature of plate 41 is within the required operating range the process will proceed to step 203. If the temperature of plate 41 is not within the required temperature range as shown by steps 202 and 216 a system failure has occurred and an error indication will be provided to the operator.

Figure 6:
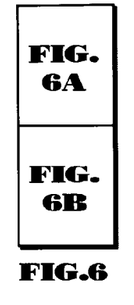
FIGS. 6A and 6B is a flow chart that illustrates a process for testing solder balls to determine solder ball type In accordance with one embodiment of the present Invention.
Figure 6A:
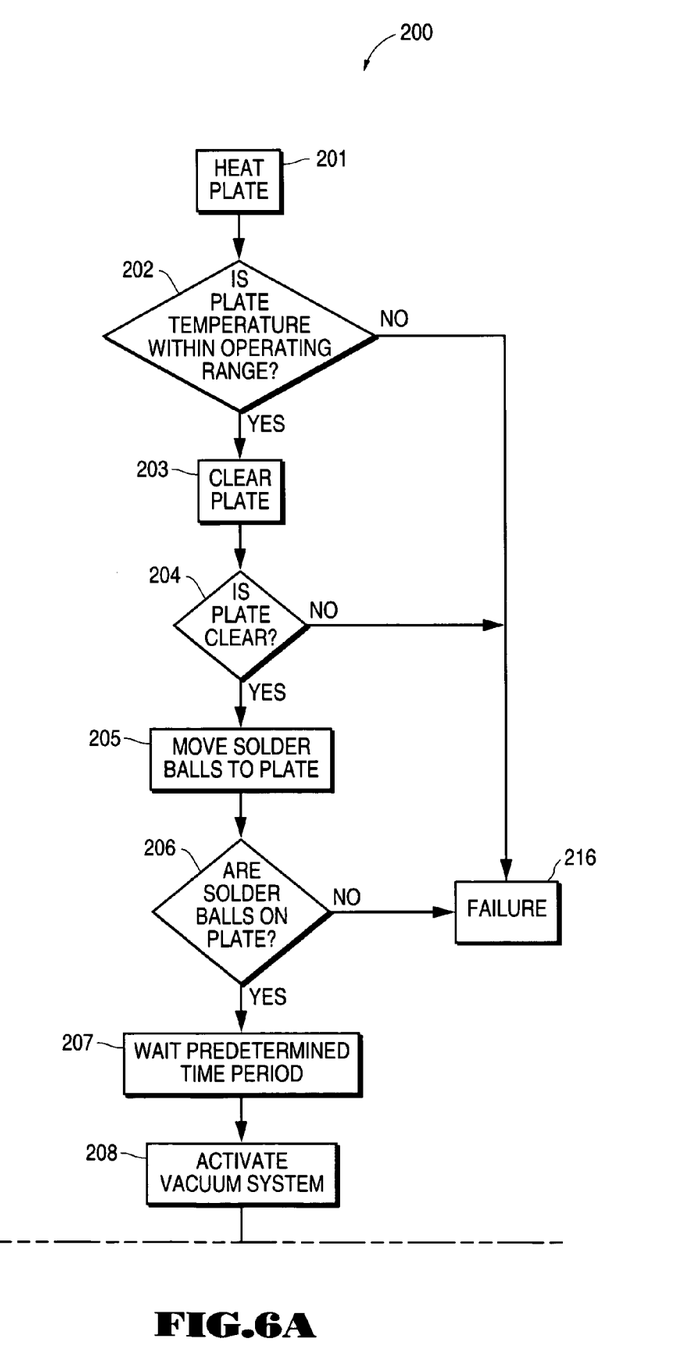
Figure 6B:
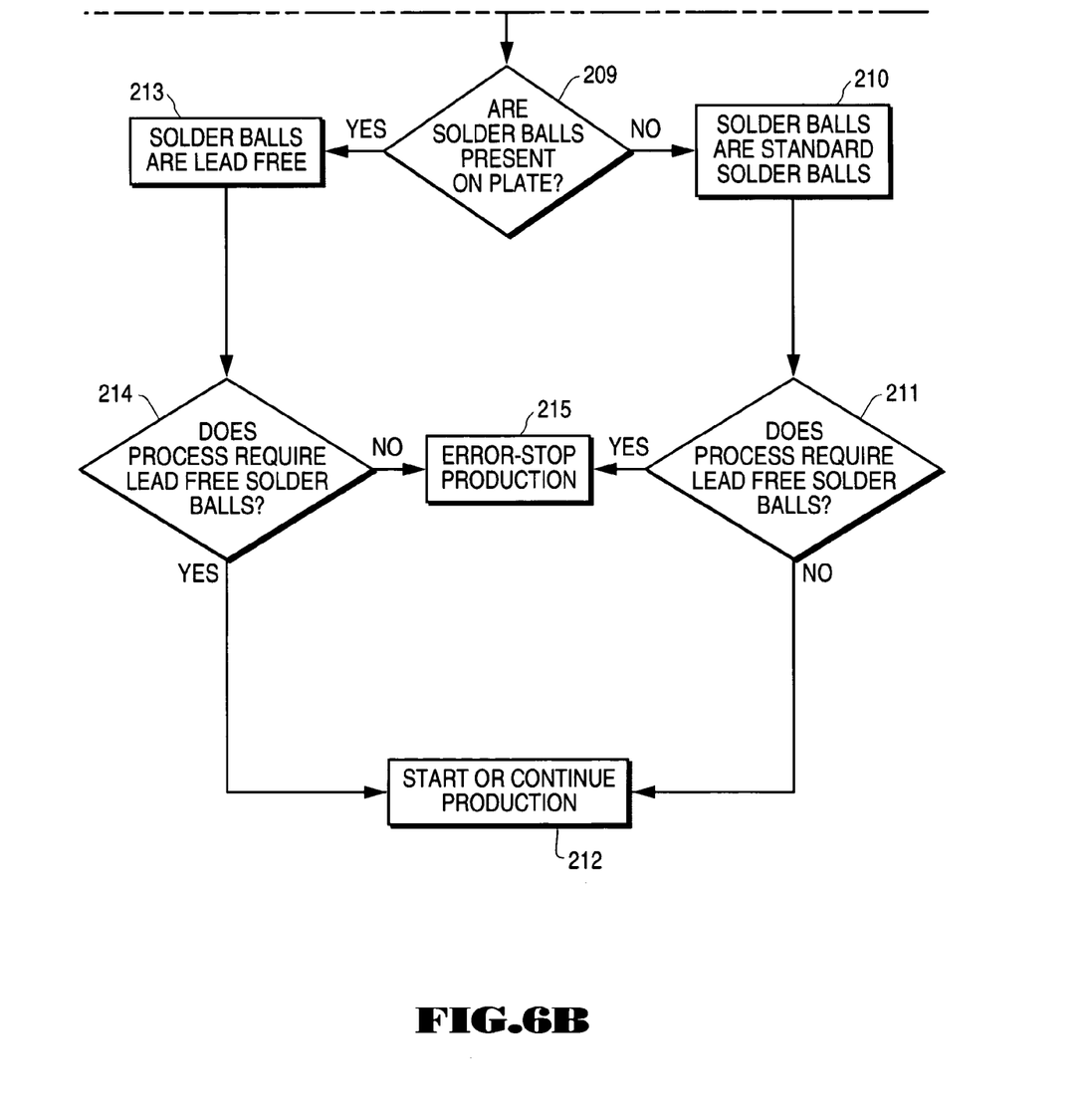

As shown by step 203 once plate 41 has reached the required temperature range plate 41 is cleared. More particularly, if thermocouple 40 indicates that the correct operating temperature has been reached, camera 54 is activated to generate images of the top of plate 41. These images are analyzed by control unit 6 to determine where on plate 41 unmelted solder balls are located. If any unmelted solder balls are detected, they are removed using pick and place mechanism 56.

Referring now to step 204, the system then checks to determine whether the top of plate 41 is clear. In the present embodiment, images from. camera 54 are generated that show the top of plate 41. Control unit 6 analyzes the images to determine whether any solder balls are present on the top surface of plate 41. If the top of plate 41 is clear (no solder balls are present) solder balls that are to be tested are moved onto plate 41 as shown by step 205. In the present embodiment solder balls are removed from ball dispensing assembly 3 to indentations 43. In one embodiment all of indentations 43 are filled with solder balls. Alternatively only some of indentations 43 are filled with solder balls. In the present embodiment control unit 6 is programmable such that the number of solder balls to be tested can be changed depending on the particular process schedule and quality control requirements.

Referring now to step 206 the system checks to determine where solder balls are located on plate 41. If no solder balls are present on plate 41 a failure has occurred as shown by steps 206 and 216 and an error indication is provided to the operator. In one embodiment, images from camera 54 are generated after the placement of solder balls into indentations 43, and before the solder balls have had a chance to melt. This image can be generated immediately after the placement of each solder ball into an indentation 43. However, alternatively a single image is generated after all of the solder balls have been placed. Control unit 6 is operable to analyze the images for determining whether or not a solder ball is present in each indentation 43. This step prevents errors that would result if a solder ball were to be dropped or misplaced.

Once all of the solder balls have been moved and are determined to be present on plate 41, a timer is initiated. Referring to steps 207-208, after a predetermined time period has elapsed, vacuum system 52 is engaged so as to apply a vacuum to each of openings 42. If the solder balls melt the suction will draw the solder ball material through openings 42 and it will fall into tray 49. In the present embodiment the time period is programmable and is a time sufficient for standard solder balls to melt.

Referring now to step 209, images from the camera 54 are generated and are analyzed to determine whether the solder balls determined to be present in step 206 have melted. If the images indicate that the solder balls are still present on plate 41 the solder balls are lead free as shown by steps 209 and 213. As shown by steps 209-210 if the images indicate that the solder balls determined to be present in step 206 are no longer present on plate 41 then the solder balls were standard solder balls that melted. If solder balls remain on the plate, a solder ball removal sequence can then be activated for removing all remaining solder balls on plate 41. Alternatively, the solder balls can be left on the plate 41 and can be cleared in step 203 of the following test.

Referring now to steps 211 and 214 when the type of solder ball does not match the type of solder ball required by the process an error indication is generated as shown by step 215 and production is stopped. More particularly, if the process requires lead free solder balls and the test indicates that the solder balls are standard solder balls, an error Indication is generated as shown by step 210-211 and 215 and the production process is stopped. The error indication can be any visual or audible output that can be perceived by an operator such as, for example, a bell, siren or other sound and/or an error message that is viewable on a display.

Similarly, when the process requires standard solder balls and the test indicates that the solder balls are lead free an error indication is generated as shown by step 215, and the production process is stopped. Referring to steps 210-212, if the process requires lead free solder balls, and the test indicates that the solder balls are lead free there is a match between the solder balls tested, and the process requirements and production will start (if the test is being performed upon initiation of production) or will continue (if the test is being performed during production). Similarly, as shown in steps 212-214, when the process requires standard solder balls and the test indicates that the solder balls are standard solder balls, there is a match between the solder balls tested, and production will start (if the test is being performed upon initiation of production) or will continue (if the test is being performed during production).

In the present embodiment, the operation of solder ball testing assembly 5 is fully automated such that solder ball testing assembly 5 automatically performs tests as required by its programming. Also, control logic within control unit 6 is operable to automatically initiate the test sequence. In the present embodiment system 20 is fully programmable and such that the timing of testing can be varied to accommodate scheduling and quality control needs.

In the present embodiment a test is performed automatically each time the solder ball attachment process is initiated so as to assure that the right type of solder balls are being used prior to manufacturing any product. Also, testing is preformed periodically throughout the solder ball attachment process. In the present embodiment tests are performed at predetermined time intervals after the initiation of the solder ball attachment process. In one embodiment, ball dispensing assembly 3 includes a sensor that detects when the solder ball reservoir is low and testing is also performed each time that the sensor indicates that the reservoir has been filled.

In the present embodiment, automated ball mounting system 20 is fully automated and is controlled by control unit 6 to automatically perform all of the steps required for mounting solder balls and testing solder balls in accordance with product requirements. In one embodiment all of the components of automated ball mounting system 20 are contained in a single integrated unit that includes a housing that encloses all of the components of automated ball mounting system 20.

The process and apparatus of the present invention allow for the determination of solder ball type automatically and quickly, preventing product defects that can result from the use of the wrong solder ball type. In addition, a single solder ball mounting system can be used to attach both standard solder balls and lead free solder balls while preventing product defects that can result from use of the wrong solder ball type. The use of a single system instead of two dedicated systems results in significant cost savings as compared to prior art processes that use one dedicated system for standard solder balls and a second dedicated system for lead free solder balls. In addition the process and apparatus of the present invention allows for quicker start-up of the manufacturing process as there is no need to send solder ball samples to a test lab and wait for test results.

The preferred embodiment of the present Invention is thus described. While the present Invention has been described In particular embodiments, it should be appreciated that the present Invention should not be construed as limited by such embodiments, but rather construed according to the following claims.

What is claimed is:

1. A testing assembly comprising:
   a plate having one or more openings that extend therethrough;
   a heating device located proximate said plate and operable to heat solder balls that are placed on said plate to a temperature between the eutectic temperature of lead-tin and the melting temperature of a lead free solder ball;
   a vacuum system coupled to said plate and operable to remove melted solder balls from said plate; and
   a detection system operable to determine whether solder balls are present on said plate after said heating device has heated said solder balls that are placed on said plate and after said vacuum system has removed said melted solder balls from said plate.

2. The testing assembly of claim 1 wherein said heating device is thermally coupled to said plate, said heating device operable to heat said plate to a temperature between the eutectic temperature of lead-tin and the melting temperature of a lead free solder ball.

3. The testing assembly of claim 1 wherein said heating device is thermally coupled to said plate, said heating device operable to heat said plate to a temperature of between 180 degrees Centigrade and 210 degrees Centigrade.

4. The testing assembly of claim 1 wherein said plate further comprises a plurality of indentations that are adapted to receive said solder balls, said openings extending below said indentations.

5. The testing assembly of claim 1 further comprising a pick-and place mechanism for moving solder balls onto said plate and for removing unmelted solder balls from said plate.

6. An automated solder ball mounting system comprising:
   a flux dispensing assembly;
   a ball dispensing assembly located proximate said flux dispensing assembly; and
   a testing assembly located proximate said ball dispensing assembly, said testing assembly operable to automatically test solder balls input into said ball dispensing assembly to determine whether tested solder balls are lead free, by heating said tested solder balls to a temperature between the eutectic temperature of lead-tin and the melting temperature of a lead free solder ball and determining whether said tested solder balls have melted.

7. The automated solder ball mounting system of claim 6 wherein said testing assembly further comprises:
   a plate having one or more openings that extend therethrough;
   a heating device located proximate said plate for heating solder balls that are placed on said plate;
   a vacuum system coupled to said plate for removing melted solder balls from said plate; and
   a detection system for determining whether solder balls are present on said plate.

8. The automated solder ball mounting system of claim 7 wherein said heating device is thermally coupled to said plate, said heating device operable to heat said plate to a temperature between the eutectic temperature of lead-tin and the melting temperature of a lead free solder ball.

9. The automated solder ball mounting system of claim 7 wherein said heating device is thermally coupled to said plate, said heating device operable to heat said plate to a temperature of between 180 degrees Centigrade and 210 degrees Centigrade.

10. The automated solder ball mounting system of claim 8 wherein said detection system includes a control unit electrically coupled to a camera, said camera operable to generate images that are interpreted by said control unit.

11. The automated solder ball mounting system of claim 9 further comprising:
    a conveyor assembly;
    a pick-and place mechanism; and
    a control unit electrically coupled to said flux dispensing assembly, said ball dispensing assembly, said conveyor assembly and said pick and place mechanism, said control unit operable to automatically stop the automated solder ball mounting process when the determined solder ball type does not match the solder ball type required.

12. The automated solder ball mounting system of claim 6 wherein said ball dispensing assembly is adapted to receive both a lead free solder ball canister and a standard solder ball canister.

* * * * *